United States Patent
Koh et al.

(10) Patent No.: US 9,037,783 B2
(45) Date of Patent: May 19, 2015

(54) NON-VOLATILE MEMORY DEVICE HAVING PARALLEL QUEUES WITH RESPECT TO CONCURRENTLY ADDRESSABLE UNITS, SYSTEM INCLUDING THE SAME, AND METHOD OF OPERATING THE SAME

(71) Applicant: SAMSUNG ELECTRONICS CO., LTD., Suwon-si, Gyeonggi-do (KR)

(72) Inventors: Seung-Wan Koh, Hwaseong-si (KR); Tae-Kyeong Ko, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 165 days.

(21) Appl. No.: 13/713,377

(22) Filed: Dec. 13, 2012

(65) Prior Publication Data

US 2013/0268721 A1 Oct. 10, 2013

(30) Foreign Application Priority Data

Apr. 9, 2012 (KR) ........................ 10-2012-0036904

(51) Int. Cl.
*G06F 12/02* (2006.01)
*G11C 5/00* (2006.01)

(52) U.S. Cl.
CPC .............. *G06F 12/0246* (2013.01); *G11C 5/00* (2013.01); *G06F 2212/7208* (2013.01)

(58) Field of Classification Search
None
See application file for complete search history.

(56) References Cited

U.S. PATENT DOCUMENTS

| | | | | |
|---|---|---|---|---|
| 5,860,080 | A * | 1/1999 | James et al. | 711/4 |
| 6,618,790 | B1 * | 9/2003 | Talreja et al. | 711/105 |
| 7,362,611 | B2 * | 4/2008 | Roohparvar | 365/185.09 |
| 7,441,050 | B2 | 10/2008 | Kubohara | |
| 7,917,689 | B2 | 3/2011 | Rothman et al. | |
| 8,112,574 | B2 | 2/2012 | Lee et al. | |
| 2003/0070055 | A1 * | 4/2003 | Johnson et al. | 711/202 |
| 2004/0170432 | A1 * | 9/2004 | Reynolds et al. | 398/49 |
| 2008/0049505 | A1 * | 2/2008 | Kim et al. | 365/185.11 |
| 2008/0320209 | A1 | 12/2008 | Lee et al. | |
| 2009/0002864 | A1 * | 1/2009 | Duelk et al. | 360/48 |
| 2009/0204872 | A1 | 8/2009 | Yu et al. | |
| 2010/0070696 | A1 * | 3/2010 | Blankenship | 711/105 |
| 2010/0161886 | A1 | 6/2010 | Toelkes et al. | |
| 2011/0004719 | A1 * | 1/2011 | Fitzgerald | 711/1 |
| 2011/0153877 | A1 | 6/2011 | King | |
| 2011/0191527 | A1 | 8/2011 | Fukuda | |
| 2011/0191529 | A1 | 8/2011 | Matsuyama et al. | |
| 2011/0194458 | A1 * | 8/2011 | Nieuwland et al. | 370/254 |

FOREIGN PATENT DOCUMENTS

| | | | |
|---|---|---|---|
| JP | 09-282223 A | 10/1997 | |
| JP | 2000-259488 A | 9/2000 | |
| JP | 2001-331363 A | 11/2001 | |

* cited by examiner

*Primary Examiner* — Duc Doan
(74) *Attorney, Agent, or Firm* — Lee & Morse, P.C.

(57) ABSTRACT

A non-volatile memory device having respective parallel queues is disclosed. The non-volatile memory device includes a plurality of concurrently addressable units. The non-volatile memory device has respective queues for the concurrently addressable units, and transfers a second command to respective queues for the remaining concurrently addressable units while a first command is executed in a part of the concurrently addressable units, and executes a second command in the remaining concurrently addressable units. Accordingly, non-volatile memory device may concurrently access the concurrently addressable units in parallel, and may have high speed.

16 Claims, 7 Drawing Sheets

NON-VOLATILE MEMORY DEVICE HAVING PARALLEL QUEUES WITH RESPECT TO CONCURRENTLY ADDRESSABLE UNITS, SYSTEM INCLUDING THE SAME, AND METHOD OF OPERATING THE SAME

CROSS-REFERENCE TO RELATED APPLICATION

This application claims priority under 35 U.S.C. §119 to Korean Patent Application No. 10-2012-0036904 filed on Apr. 9, 2012, the entire contents of which are incorporated herein by reference in their entirety.

BACKGROUND

1. Field

Embodiments relate to a semiconductor memory device and more particularly, to a non-volatile memory device, a system including the non-volatile memory device, and a method of operating the non-volatile memory device.

2. Description of the Related Art

Non-volatile memory devices, particularly a NAND-type flash memory device, may require increased operational speed to keep up with demands of newer products.

SUMMARY

One or more embodiments provide a non-volatile memory device including a plurality of concurrently addressable units (CAUs). The non-volatile memory device has respective queues for the CAUs, and transfers a second command to respective queues for the remaining CAUs when a first command is executed in a part of the CAUs, and executes a second command in the remaining CAUs.

The non-volatile memory device may include a NAND-type flash memory device.

The non-volatile memory device may include a memory unit comprising the plurality of CAUs and a control circuit. The control circuit has respective queues for the CAUs, and transfers the second command to respective queues for a second CAUs when the first command is executed in a first CAUs, and executes the second command in the second CAUs.

The control circuit may include an address decoder and a scheduler. The address decoder decodes an address received from an exterior, and the scheduler performs time-division scheduling on the respective queues of the CAUs based on the decoded address.

The control circuit may transmit and receive an address, a command and data through an internal channel to and from the CAUs.

The control circuit may concurrently access the CAUs using a chip enable signal.

The control circuit may transmit the chip enable signal to a part of the CAUs through a first bus, and may transmit the chip enable signal to the remaining CAUs through a second bus.

The non-volatile memory device may include a memory unit and a control circuit. The memory unit includes the plurality of CAUs having their own respective queues. The control circuit transfers the second command to respective queues for a second CAUs when the first command is executed in a first CAUs, and executes the second command in the second CAUs.

The control circuit may include an address decoder and a scheduler. The address decoder decodes an address received from an exterior, and the scheduler performs time-division scheduling on the respective queues of the CAUs of the memory unit based on the decoded address.

The non-volatile memory device may include a memory unit comprising the plurality of CAUs and a control circuit. The control circuit has respective queues for the CAUs, and transfers the second command to respective queues for a second CAUs when the first command is executed in a first CAUs, and executes the second command in the second CAUs, and executes an error correction for the CAUs.

The control circuit may include an address decoder, a scheduler and an error correction circuit. The address decoder decodes an address received from an exterior. The scheduler performs time-division scheduling on the respective queues of the CAUs based on the decoded address. The error correction circuit performs error correction for the CAUs.

The non-volatile memory device may be a stack memory device in which a plurality of chips configured to transmit and receive data and control signals through through-silicon-vias (TSVs) are stacked.

One or more embodiments provide a method of operating a non-volatile memory device having a plurality of CAUs includes receiving a command and an address from a host; decoding the address to determine for which CAUs the received command is; transferring the command and address information to a queue of a corresponding CAU; sequentially searching queues for respective CAUs; transferring a command that a current pointer points to, to the corresponding CAU; and executing the command that the current pointer points to.

The method of operating a non-volatile memory device may sequentially search queues for respective CAUs after transferring the command that the current pointer points to, to the corresponding CAU.

The sequentially searching queues for respective CAUs may include determining whether a data input/output (IO) bus is in a busy state; transferring a command that a current pointer points to, to the corresponding CAU, when the data IO bus is not in a busy state; and sequentially searching queues for respective CAUs after a waiting period for the busy state to shift, when the data IO bus is in a busy state.

The method may include transferring a second command to the remaining concurrently addressable units while executing the command to which the current pointer points in the corresponding concurrently addressable units.

One or more embodiments provide a non-volatile memory device, including a plurality of concurrently addressable units, respective queues for the plurality of the concurrently addressable units, respectively, and a control circuit, wherein the control circuit is configured to transfer a second command to respective queues for remaining concurrently addressable units while a first command is executed in some of the concurrently addressable units.

The plurality of queues may be in the control circuit or in a corresponding concurrently addressable unit.

The control circuit may include an address decoder configured to decode a received address to determine which concurrently addressable units correspond to the first command.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the embodiments. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in herein may be performed otherwise. That is, the respective steps may be performed in a specified order, substantially at the same time, or in reverse order.

Embodiments will now be described more fully hereinafter with reference to the accompanying drawings.

Figure 1:
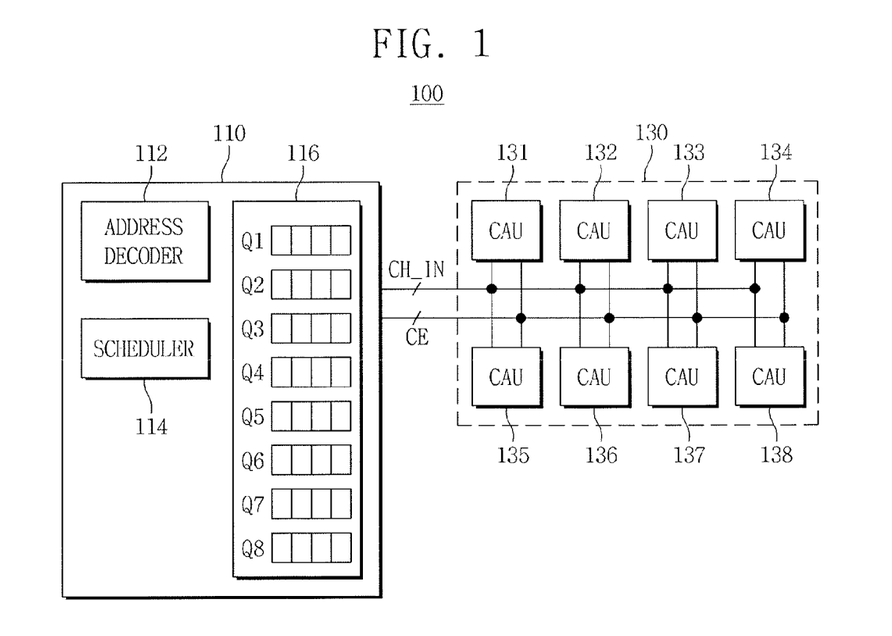
FIG. 1 illustrates a block diagram of a non-volatile memory device having a parallel queue for respective concurrently addressable units (CAUs) according to an embodiment.

FIG. 1 illustrates a block diagram of a non-volatile memory device 100 having a parallel queue for respective concurrently addressable units (CAUs) according to an embodiment. Referring to FIG. 1, the non-volatile memory device 100 may include a control circuit 110 and a memory unit 130.

The memory unit 130 may include a plurality of CAUs 131 to 138 that operate independently. The control circuit 110 has respective queues for the CAUs 131 to 138, and transfers a second command to respective queues for second CAUs when a first command is executed in first CAUs and executes the second command in the second CAUs.

The control circuit 110 may include an address decoder 112, a scheduler 114, and a queue circuit 116. The queue circuit 116 may include respective queues Q1 to Q8 for the CAUs 131 to 138.

The control circuit 110 receives a command and address from a host, and determines which CAUs correspond to the received command. Further, the control circuit 110 transfers the command and address information to a queue of a corresponding CAU, sequentially searches queues for respective CAUs, and transfers a command to which a current pointer points to the corresponding CAU. The control circuit 110 sequentially searches the queues for the respective CAUs continuously after transferring the command to which the current pointer points to the corresponding CAU.

The address decoder 112 decodes an address received from a host. The scheduler 114 performs time-division scheduling on the respective queues of the CAUs based on the decoded address.

Communication between the control circuit 110 and the CAUs 131 to 138 may be done through an internal channel CH_IN. The internal channel CH_IN may include a plurality of buses. The control circuit 110 may transmit a command, address information, and various control signals to the CAUs 131 to 138 through the internal channel CH_IN, and may transmit/receive data to/from the CAUs 131 to 138.

The non-volatile memory device 100 may transmit a chip enable signal CE to the CAUs 131 to 138 through a bus. The non-volatile memory device 100 may concurrently access the CAUs 131 to 138 included in the memory unit 130 using the chip enable signal CE.

The non-volatile memory device 100 may include a NAND-type flash memory device.

Figure 2:
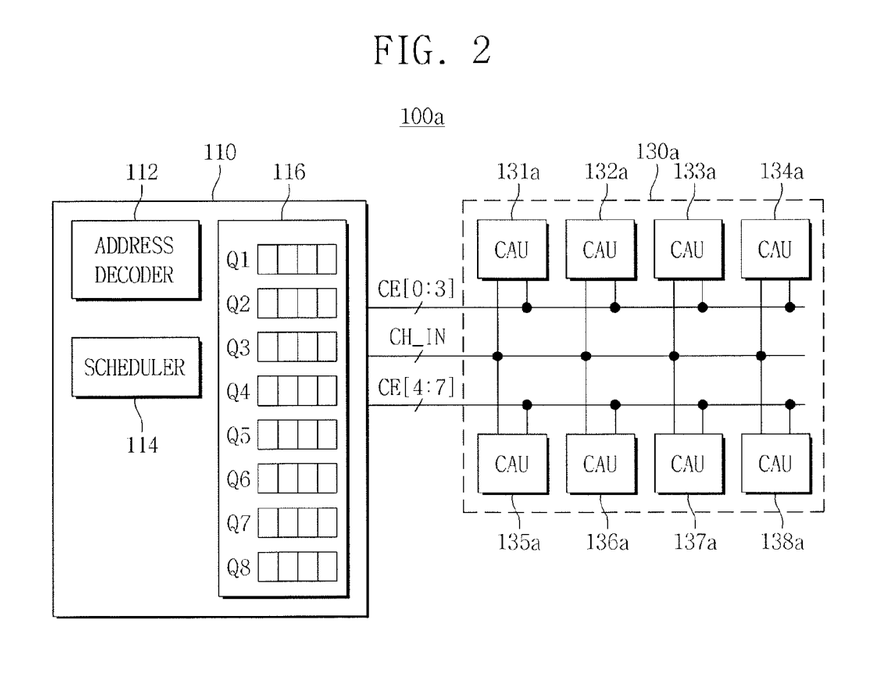
FIG. 2 illustrates a block diagram of a non-volatile memory device having a parallel queue for respective CAUs according to another embodiment.

FIG. 2 illustrates a block diagram of a non-volatile memory device 100a having a parallel queue for respective CAUs according to another embodiment. Referring to FIG. 2, the non-volatile memory device 100a may include a control circuit 110 and a memory unit 130a.

The memory unit 130a may include a plurality of CAUs 131a to 138a that operate independently. The control circuit 110 has respective queues for the CAUs 131a to 138a, and transfers a second command to respective queues for second CAUs when a first command is executed in first CAUs, and executes the second command in the second CAUs.

The control circuit 110 may include the address decoder 112, the scheduler 114, and the queue circuit 116. The queue circuit 116 may include respective queues Q1 to Q8 for the CAUs 131a to 138a.

Communication between the control circuit 110 and the CAUs 131a to 138a may be done through the internal channel CH_IN. The internal channel CH_IN may include a plurality of buses. The control circuit 110 may transmit a command, address information, and various control signals to the CAUs 131a to 138a through the internal channel CH_IN, and may transmit/receive data to/from the CAUs 131a to 138a.

The non-volatile memory device 100a may transmit a chip enable signal CE to the CAUs 131a to 138a through a bus. The non-volatile memory device 100a may concurrently access the CAUs 131a to 138a included in the memory unit 130a using the chip enable signal CE. In the non-volatile memory device 100a of FIG. 2, the chip enable signal CE[0:3] that is transmitted to the CAUs 131a to 134a, and the chip enable signal CE[4:7] that is transmitted to the CAUs 135a to 138a are transmitted through different buses.

Figure 3:
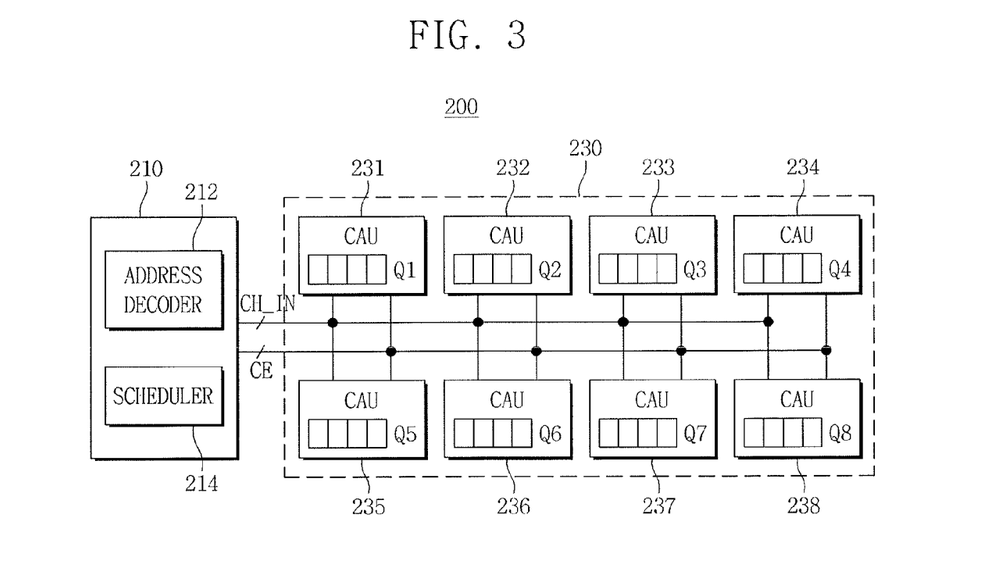
FIG. 3 illustrates a block diagram of a non-volatile memory device having a parallel queue for respective CAUs according to still another embodiment.

FIG. 3 illustrates a block diagram of a non-volatile memory device 200 having a parallel queue for respective CAUs according to still another embodiment. Referring to FIG. 3, the non-volatile memory device 200 may include a control circuit 210 and a memory unit 230.

The memory unit 230 may include a plurality of CAUs 231 to 238 that operate independently and have their own respective queues Q1 to Q8. The control circuit 210 transfers a second command to respective queues for second CAUs when a first command is executed in first CAUs, and executes the second command in the second CAUs.

The control circuit 210 may include an address decoder 212 and a scheduler 214.

The control circuit 210 receives a command and address from a host, and determines which CAUs the received command corresponds. Further, the control circuit 210 transfers the command and address information to a queue of a corresponding CAU, sequentially searches queues for respective CAUs, and transfers a command to which a current pointer points to the corresponding CAU. The control circuit 210 sequentially searches the queues for the respective CAUs continuously after transferring the command that the current pointer points to, to the corresponding CAU.

The address decoder 212 decodes an address received from a host. The scheduler 214 performs time-division scheduling on the respective queues Q1 to Q8 of the CAUs based on the decoded address.

Communication between the control circuit 210 and the CAUs 231 to 238 may be done through an internal channel CH_IN. The internal channel CHIN may include a plurality of buses. The control circuit 210 may transmit a command, address information, and various control signals to the CAUs 231 to 238 through the internal channel CH_IN, and may transmit/receive data to/from the CAUs 231 to 238.

The non-volatile memory device 200 may transmit a chip enable signal CE to the CAUs 231 to 238 through a bus. The non-volatile memory device 200 may concurrently access the CAUs 231 to 238 included in the memory unit 230 using the chip enable signal CE.

In the non-volatile memory device 200 shown in FIG. 3, the respective queues Q1 to Q8 for the CAUs 231 to 238 are included in the respective CAUs 231 to 238 rather than in the control circuit 210, in contrast to the non-volatile memory device 100 of FIG. 1.

The non-volatile memory device 200 of FIG. 3 may include a NAND-type flash memory device.

Figure 4:
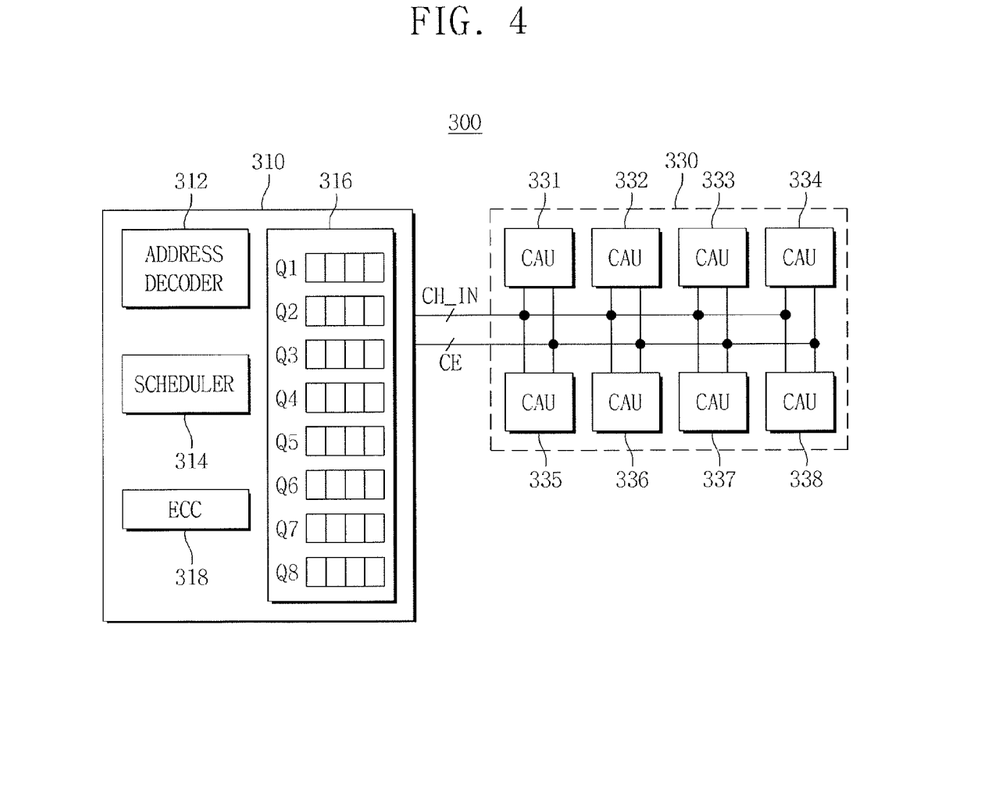
FIG. 4 illustrates a block diagram of a non-volatile memory device having a parallel queue for respective CAUs according to yet another embodiment.

FIG. 4 illustrates a block diagram of a non-volatile memory device 300 having a parallel queue for respective CAUs according to yet another embodiment. Referring to FIG. 4, the non-volatile memory device 300 may include a control circuit 310 and a memory unit 330.

The memory unit 330 may include a plurality of CAUs 331 to 338 that operate independently. The control circuit 310 has respective queues for the CAUs 331 to 338, and transfers a second command to respective queues for a second CAUs when a first command is executed in a first CAUs, and executes the second command in the second CAUs.

The control circuit 310 may include an address decoder 312, a scheduler 314, an error correction circuit 318, and a queue circuit 316. The queue circuit 316 may include respective queues Q1 to Q8 for the CAUs 331 to 338.

The control circuit 310 receives a command and address from a host, and determines which CAUs correspond to the received command. Further, the control circuit 310 transfers the command and address information to a queue of a corresponding CAU, sequentially searches queues for respective CAUs, and transfers a command to which a current pointer points to the corresponding CAU. The control circuit 310 sequentially searches the queues for the respective CAUs continuously after transferring the command to which the current pointer points to the corresponding CAU. Further, the control circuit 310 receives an address and data, and performs error correction for the CAUs 331 to 338 based on the address and the data.

The address decoder 312 decodes an address received from a host. The scheduler 314 performs time-division scheduling on the respective queues of the CAUs based on the decoded address. The error correction circuit 318 corrects data error generated in the respective CAUs 331 to 338.

Communication between the control circuit 310 and the CAUs 331 to 338 may be done through an internal channel CH_IN. The internal channel CH_IN may include a plurality of buses. The control circuit 310 may transmit a command, address information, and various control signals to the CAUs 331 to 338 through the internal channel CH_IN, and may transmit/receive data to/from the CAUs 331 to 338.

The non-volatile memory device 300 may transmit a chip enable signal CE to the CAUs 331 to 338 through a bus. The non-volatile memory device 300 may concurrently access the CAUs 331 to 338 included in the memory unit 330 using the chip enable signal CE.

The non-volatile memory device 300 may include a NAND-type flash memory device.

The non-volatile memory device 100, 100a, 200 or 300 shown in FIGS. 1 to 4 may include a non-volatile memory chip, such as a flash memory, a phase-change memory, a magnetic RAM (MRAM), or a resistive RAM (RRAM), or a combination thereof.

Figure 5:
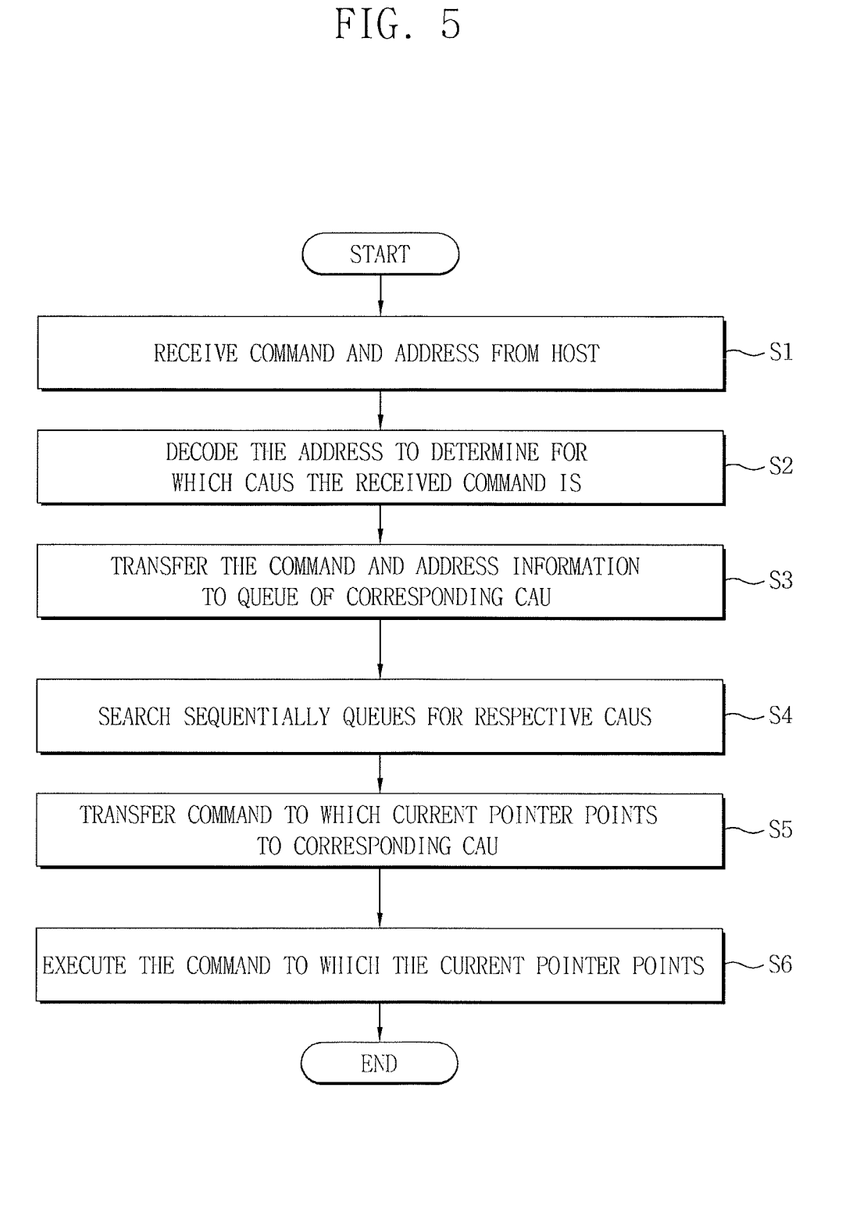
FIG. 5 illustrates a flowchart of a method of operating a non-volatile memory device having a parallel queue for respective CAUs according to an embodiment.

FIG. 5 illustrates a flowchart of a method of operating a non-volatile memory device having a parallel queue for respective CAUs according to an embodiment.

Referring to FIG. 5, the method of operating a non-volatile memory device may include the following operations:

1) receiving a command and an address from a host (S1).
2) decoding the address to determine for which CAUs the received command is (S2).
3) transferring the command and address information to a queue of a corresponding CAU (S3).
4) sequentially searching queues for respective CAUs (S4).
5) transferring a command to which a current pointer points to the corresponding CAU (S5).
6) executing the command to which the current pointer points (S6).

The method of operating a non-volatile memory device of FIG. 5 may include sequentially searching queues for respective CAUs after transferring the command to which the current pointer points to the corresponding CAU.

Figure 6:
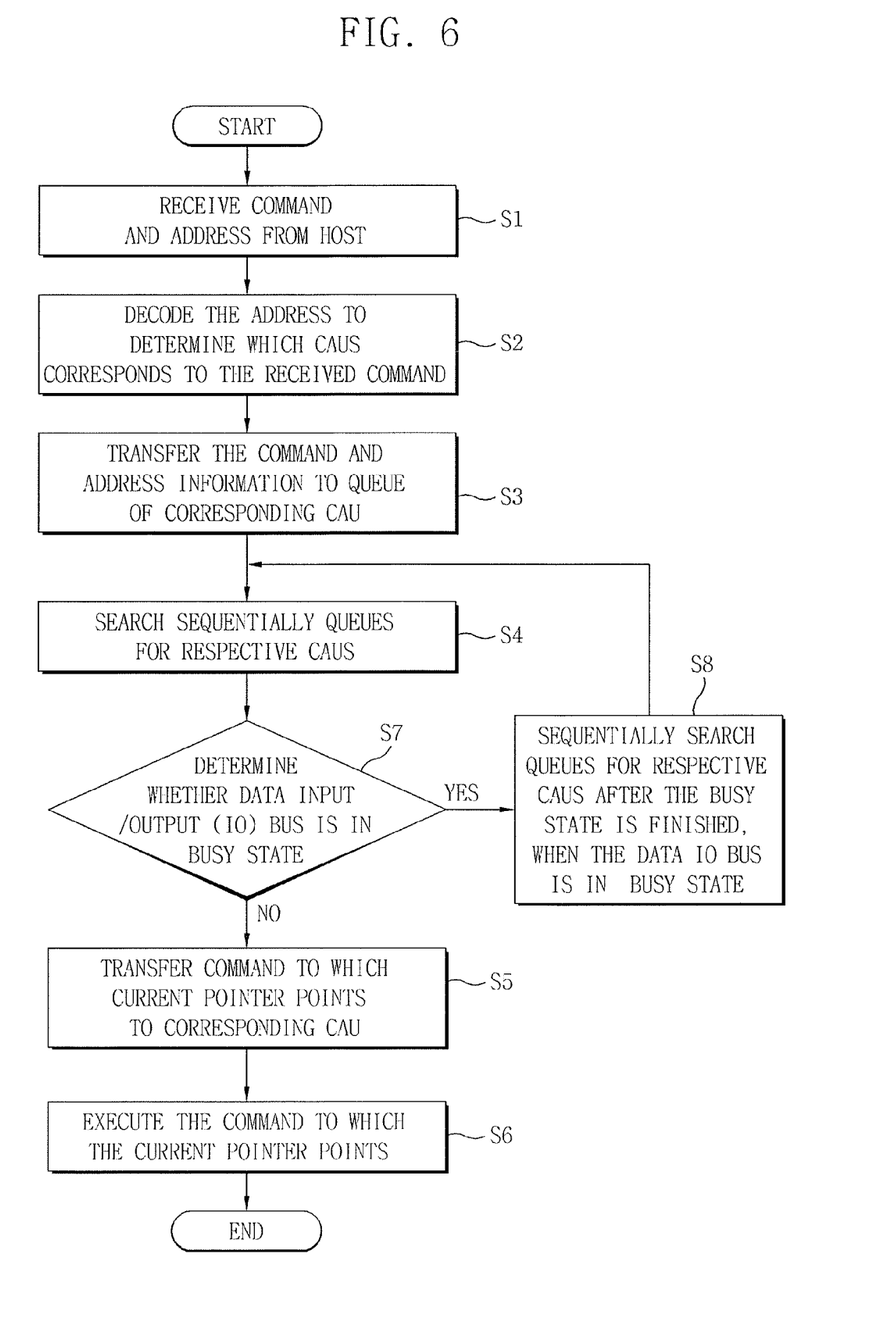
FIG. 6 illustrates a flowchart of a method of operating a non-volatile memory device having a parallel queue for respective CAUs according to another embodiment.

FIG. 6 is a flowchart illustrating a method of operating a non-volatile memory device having a parallel queue for respective CAUs according to another embodiment.

Referring to FIG. 6, the method of operating a non-volatile memory device may include the following operations:

1) receiving a command and an address from a host (S1).
2) decoding the address to determine which CAUs corresponds to the received command (S2).
3) transferring the command and address information to a queue of a corresponding CAU (S3).
4) sequentially searching queues for respective CAUs (S4).
5) determining whether a data input/output (IO) bus is in a busy state (S7).
6) transferring a command to which a current pointer points to the corresponding CAU, when the data IO bus is not in a busy state (S5).
7) executing the command to which the current pointer points (S6).
8) sequentially searching queues for respective CAUs after a waiting period for the busy state to shift, when the data IO bus is in a busy state (S8).

The method of operating a non-volatile memory device of FIG. 6 may include sequentially searching queues for respective CAUs after transferring the command to which the current pointer points to the corresponding CAU.

Figure 7:
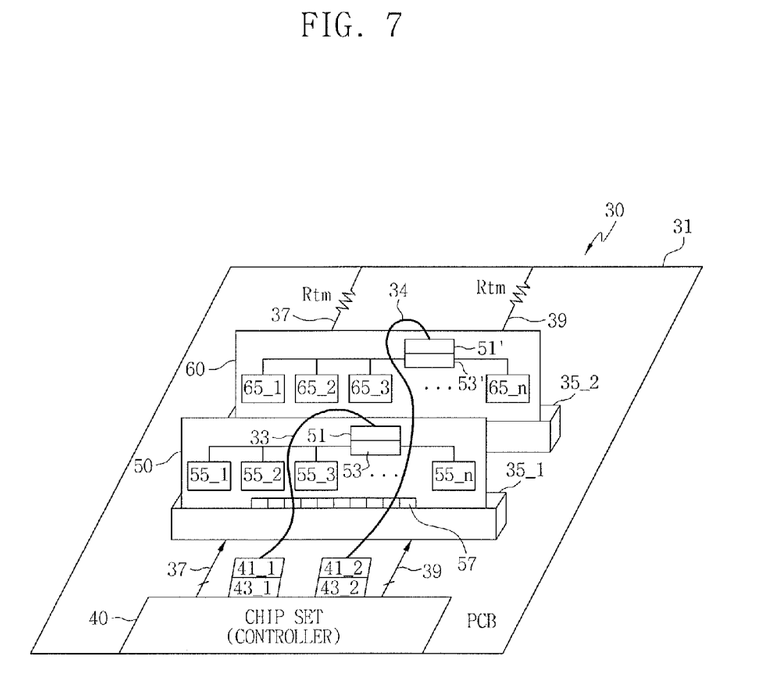
FIG. 7 illustrates a diagram of an example of a memory system including a non-volatile memory device according to embodiments.

FIG. 7 is a diagram of an example of a memory system 30 including a non-volatile memory device according to embodiments.

Referring to FIG. 7, the memory system 30 may include a mother board 31, a chipset (or controller) 40, slots 35_1 and 35_2, memory modules 50 and 60, and transmission wires 33 and 34. Buses 37 and 39 may connect the chipset 40 to the slots 35_1 and 35_2. A terminal resistor Rtm may terminate each of the buses 37 and 39 disposed on a printed circuit board (PCB) of the mother board 31.

Although FIG. 7 illustrates two slots 35_1 and 35_2 and two memory modules 50 and 60 for brevity, the memory system 30 may include an arbitrary number of slots and an arbitrary number of memory modules.

The chipset 40 may be mounted on the PCB of the mother board 31 and control operation of the memory system 30. The chipset 40 may include connectors 41_1 and 41_2 and converters 43_1 and 43_2.

The converter 43_1 may receive parallel data generated by the chipset 40, convert the parallel data into serial data, and output the serial data to the transmission wire 33 through the connector 41-1. The converter 43_1 may receive serial data through the transmission wire 33, convert the serial data into parallel data, and output the parallel data to the chipset 40.

The converter 43_2 may receive parallel data generated by the chipset 40, convert the parallel data into serial data, and output the serial data to the transmission wire 34 through the connector 41-2. The converter 43_2 may receive serial data through the transmission wire 34, convert the serial data into parallel data, and output the parallel data to the chipset 40. The transmission wires 33 and 34 included in the memory system 30 may be a plurality of optical fibers.

The memory module 50 may include a plurality of memory devices 55_1 to 55_n, a first connector 57, a second connector 51, and converters 53. The memory module 60 may include a plurality of memory devices 65_1 to 65_n, a first connector 57', a second connector 51', and converters 53'.

The first connector 57 may transmit a low-speed signal from the chipset 40 to memory devices, while the second connector 51 may be connected to the transmission wire 33 configured to transmit a high-speed signal.

The converter 53 may receive serial data through the second connector 51, convert the serial data into parallel data, and output the parallel data to the plurality of memory devices 55_1 to 55n. Also, the converter 53 may receive parallel data from the plurality of memory devices 55_1 to 55_n, convert the parallel data into serial data, and output the serial data to the second connector 51.

The plurality of memory devices 55_1 to 55_n and 65_1 to 65_n shown in FIG. 7 may be non-volatile memory devices according to embodiments. Accordingly, each of the plurality of memory devices 55_1 to 55_9 may have respective queues for the CAUs, and may transfer a second command to respective queues for remaining CAUs when a first command is executed in some the CAUs, and execute a second command in the remaining CAUs. The plurality of memory devices 55_1 to 559 may concurrently access the CAUs in parallel, and may have less idling time and have high speed.

The plurality of memory devices 55_1 to 55_9 may include a non-volatile memory chip, such as a flash memory, a phase-change memory, a magnetic RAM (MRAM), or a resistive RAM (RRAM), or a combination thereof.

Figure 8:
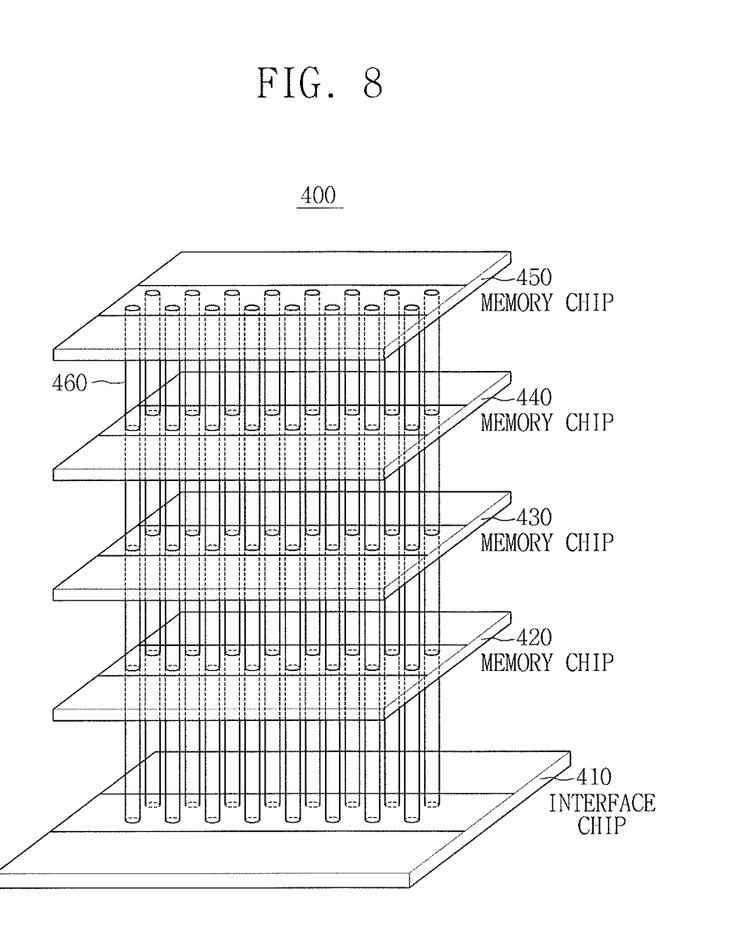
FIG. 8 illustrates a simplified perspective view of an example of a stack memory device including a non-volatile memory device according to embodiments.

FIG. 8 is a simplified perspective view of an example of a stack memory device 400 including a non-volatile memory device according to embodiments.

Referring to FIG. 8, the stack semiconductor device 400 may include an interface 410 and memory chips 420, 430, 440, and 450 electrically connected by through-silicon vias (TSVs) 460. Although FIG. 8 illustrates the TSVs 460 disposed in two rows, the stack semiconductor device 400 may include an arbitrary number of TSVs.

Each of the memory chips 420, 430, 440, and 450 included in the stack semiconductor device 400 may have respective queues for the CAUs, and may transfer a second command to respective queues for the remaining CAUs when a first command is executed in a part of the CAUs, and execute a second command in the remaining CAUs. The plurality of memory devices 55_1 to 55_9 may concurrently access the CAUs in parallel, and may have less idling time and have high speed. The interface chip 410 may serve as an interface between the memory chips 420, 430, 440, and 450 and an external apparatus.

Figure 9:
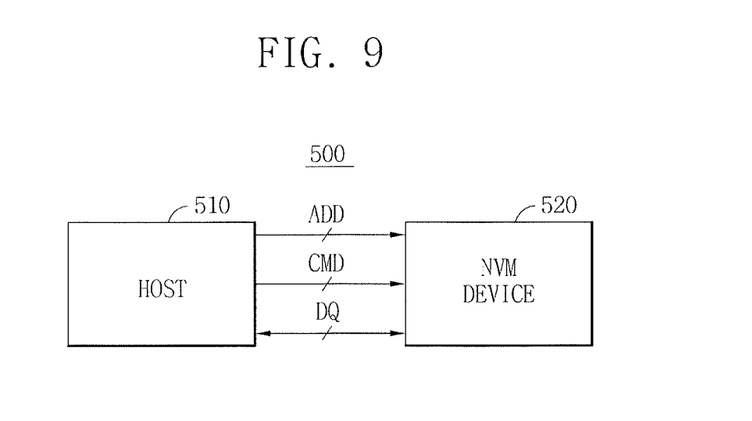
FIG. 9 illustrates a diagram of another example of a memory system including a non-volatile memory device according to embodiments.

FIG. 9 is a diagram of another example of a memory system including a non-volatile memory device according to embodiments.

Referring to FIG. 9, the memory system 500 may include a host 510 and a non-volatile memory device 520.

The host 510 generates address signals ADD and command signals CMD, and provides the address signals ADD and the command signals CMD to the non-volatile memory device 520 through buses. Data DQ may be transmitted from the host 510 to the non-volatile memory device 520 through the buses, or transmitted from the non-volatile memory device 520 to the host 510 through the buses.

The non-volatile memory device 520 may be non-volatile memory devices according to embodiments. Accordingly, the non-volatile memory device 520 may have respective queues for the CAUs, and may transfer a second command to respective queues for remaining CAUs when a first command is executed in some of the CAUs, and execute a second command in the remaining CAUs. The non-volatile memory device 520 may concurrently access the CAUs in parallel, and may have less idling time and have high speed.

Figure 10:
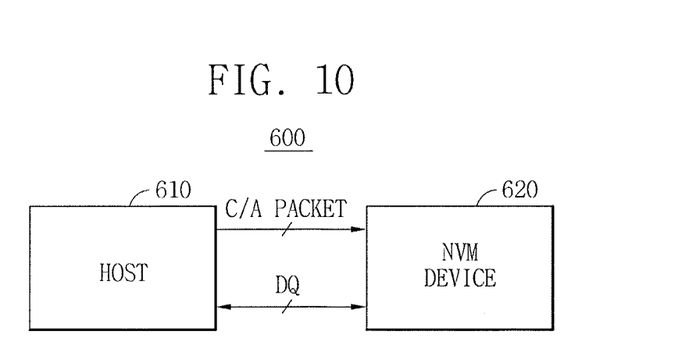
FIG. 10 illustrates a diagram of still another example of a memory system including a non-volatile memory device according to embodiments.

FIG. 10 illustrates a diagram of still another example of a memory system 600 including a non-volatile memory device according to embodiments. Referring to FIG. 10, the memory system 600 may include a host 610 and a non-volatile memory device 620.

The host 610 generates an address/command signal (C/A PACKET), which is a packetized signal of address signals ADD and command signals CMD, and provides the address/command signal (C/A PACKET) to the non-volatile memory device 620 through buses. Data DQ may be transmitted from the host 610 to the non-volatile memory device 620 through the buses, or transmitted from the non-volatile memory device 620 to the host 610 through the buses.

The non-volatile memory device 620 may be non-volatile memory devices according to embodiments. Accordingly, the non-volatile memory device 620 may have respective queues for the CAUs, and may transfer a second command to respective queues for remaining CAUs while a first command is executed in some of the CAUs, and execute a second command in the remaining CAUs.

Figure 11:
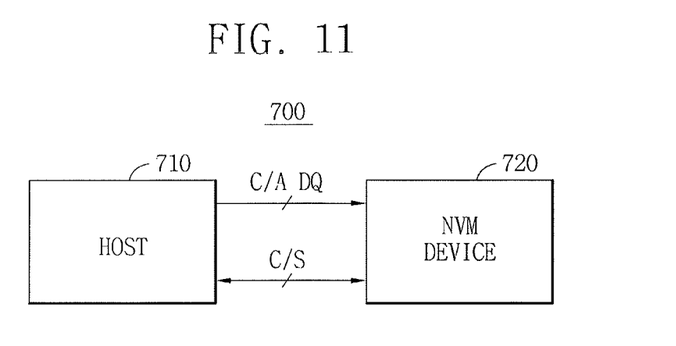
FIG. 11 illustrates a diagram of yet another example of a memory system including a non-volatile memory device according to embodiments.

FIG. 11 is a diagram of yet another example of a memory system 700 including a non-volatile memory device according to embodiments.

Referring to FIG. 11, the memory system 700 may include a host 710 and a non-volatile memory device 720.

The host 710 generates an address/command/data signal (C/A DQ), which is a packetized signal of address signals ADD, command signals CMD and data DQ, and provides the address/command/data signal (C/A DQ) to the non-volatile memory device 720 through buses. A control signal (C/S) may be transmitted from the host 710 to the non-volatile memory device 720 through buses, or transmitted from the non-volatile memory device 720 to the host 710 through the buses.

The non-volatile memory device 720 may be non-volatile memory devices according to embodiments. Accordingly, the non-volatile memory device 720 may have respective queues for the CAUs, and may transfer a second command to respective queues for the remaining CAUs when a first command is executed in a part of the CAUs, and execute a second command in the remaining CAUs.

Figure 12:
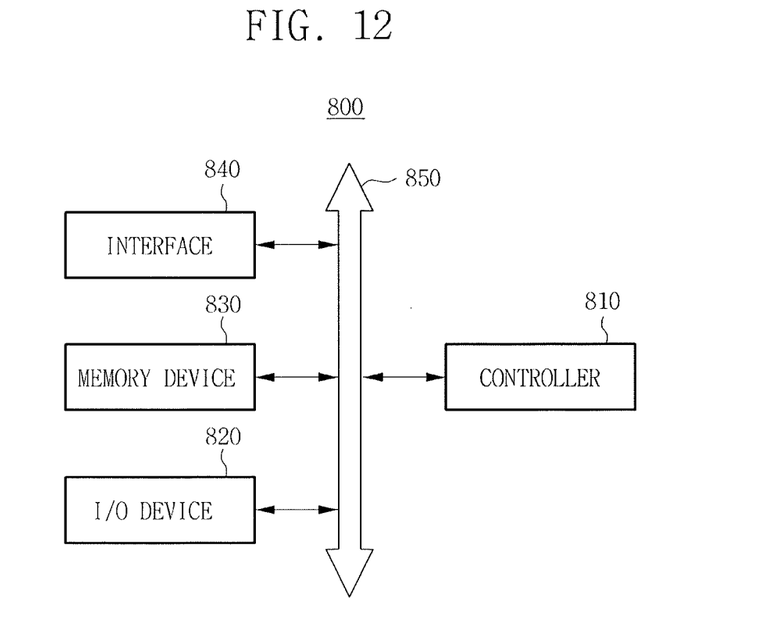
FIG. 12 illustrates a block diagram of an example of an electronic system including a non-volatile memory device according to embodiments.

FIG. 12 is a block diagram of an example of an electronic system 800 including a non-volatile memory device according to embodiments.

Referring to FIG. 12, the electronic system 800 according to the embodiments may include a controller 810, an I/O device 820, a memory device 830, an interface 840, and a bus 850. The memory device 830 may include a non-volatile memory device according to embodiments. The bus 850 may provide a path through which data may be transmitted among the controller 810, the I/O device 820, the memory device 830, and the interface 840.

The controller 810 may include at least one of at least one microprocessor (MP), at least one digital signal processor (DSP), at least one microcontroller (MC), and logic devices capable of similar functions thereto. The I/O device 820 may include at least one of a keypad, a keyboard, and a display device. The memory device 830 may serve to store data and/or commands executed by the controller 810.

The memory device 830 may include a non-volatile memory chip, such as a flash memory, a phase-change memory, a magnetic RAM (MRAM), or a resistive RAM (RRAM), or a combination thereof.

The memory device 830 may include a non-volatile memory device according to embodiments. The non-volatile memory device included in the memory device 830 may have respective queues for the CAUs, and may transfer a second command to respective queues for the remaining CAUs when a first command is executed in a part of the CAUs, and execute a second command in the remaining CAUs.

The interface 840 may serve to transmit/receive data to/from a communication network. The interface 840 may include an antenna or a wired/wireless transceiver and transmit/receive data by wire or wirelessly. Also, the interface 440 may include an optical fiber and transmit/receive data through the optical fiber. An application chipset, a camera image processor (CIP), and an I/O device may be further provided in the electronic system 800.

The electronic system 800 may be embodied by a mobile system, a personal computer (PC), an industrial computer, or a logic system with various functions. For example, the mobile system may be any one of a personal digital assistant (PDA), a portable computer (PC), a web tablet, a mobile phone, a wireless phone, a laptop computer, a memory card, a digital music system, and a data transmission/receiving system. When the electronic system 800 is an apparatus capable of wireless communication, the electronic system 800 may be used for a communication system, such as a code division multiple access (CDMA), a global system for mobile communication (GSM), a North American digital cellular (NADC), an enhanced-time division multiple access (E-TDMA), a wideband code division multiple access (WCDMA), or CDMA2000.

Embodiments may be applied to a semiconductor device, and particularly to a non-volatile memory device and a memory system including the non-volatile memory device.

By way of summary and review, the non-volatile memory device according to embodiments may include a plurality of concurrently addressable units (CAUs), may have respective queues for the CAUs, and may transfer a second command to respective queues for remaining CAUs while a first command is executed in some of the CAUs, and may execute a second command in the remaining CAUs. Accordingly, the non-volatile memory device according to one or more embodiments may concurrently access the CAUs in parallel, may have high speed, and/or may decrease idling time of CAUs. Other embodiments provide a memory system including the non-volatile memory device and a method of operating the non-volatile memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A non-volatile memory device, comprising:
a plurality of concurrently addressable memory units including first concurrently addressable memory units and second concurrently addressable memory units; and
a memory control circuit, wherein:
the non-volatile memory device has respective queues for the concurrently addressable memory units, and
the memory control circuit transfers a second command to respective queues for the second concurrently addressable memory units while a first command is executed in the first concurrently addressable memory units, and executes the second command in the second concurrently addressable memory units, wherein
a respective queue is in a corresponding concurrently addressable memory unit.

2. The non-volatile memory device as claimed in claim 1, which includes a NAND-type flash memory.

3. The non-volatile memory device as claimed in claim 1, comprising: a memory unit including the plurality of the concurrently addressable memory units.

4. The non-volatile memory device as claimed in claim 3, wherein the memory control circuit comprises:
an address decoder configured to decode an address received from an exterior; and
a scheduler configured-to perform time-division scheduling on the respective queues of the concurrently addressable memory units based on the decoded address.

5. The non-volatile memory device as claimed in claim 3, wherein the memory control circuit is configured to transmit and receive an address, a command and data through an internal channel to and from the concurrently addressable memory units.

6. The non-volatile memory device as claimed in claim 3, wherein the memory control circuit is configured to concurrently access the concurrently addressable memory units using a chip enable signal.

7. The non-volatile memory device as claimed in claim 6, wherein the memory control circuit is configured to transmit the chip enable signal to the concurrently addressable memory units through at least two of separate buses.

8. The non-volatile memory device as claimed in claim 3, wherein
the memory control circuit executes an error correction for the concurrently addressable memory units.

9. The non-volatile memory device as claimed in claim 8, wherein the memory control circuit comprises:
an address decoder configured to decode an address received from an exterior;
a scheduler configured to perform time-division scheduling on the respective queues of the concurrently addressable memory units based on the decoded address; and
an error correction circuit configured to perform error correction for the concurrently addressable memory units.

10. The non-volatile memory device as claimed in claim 1, wherein the non-volatile memory device is a stack memory device in which a plurality of chips configured to transmit and receive data and control signals through through-silicon-vias (TSVs) are stacked.

11. A method of operating a non-volatile memory device having a plurality of concurrently addressable memory units; respective queues for the plurality of the concurrently addressable memory units; and a memory control circuit, wherein a respective queue is in a corresponding concurrently addressable memory unit, the method comprising:
receiving a command and an address from a host;
decoding the address to determine which concurrently addressable memory units correspond to the received command;
transferring the command and address information to queues of corresponding concurrently addressable memory units by the memory control circuit;
sequentially searching queues of remaining concurrently addressable units;
transferring a command to the corresponding concurrently addressable memory units;
executing the command in the corresponding concurrently addressable memory units; and
transferring a second command to the remaining concurrently addressable memory units by the memory control circuit while executing the command in the corresponding concurrently addressable memory units.

12. The method as claimed in claim 11, wherein the method includes sequentially searching queues for respective concurrently addressable memory units after transferring the command to the corresponding concurrently addressable memory units.

13. The method as claimed in claim 11, wherein the sequentially searching queues for respective concurrently addressable memory units comprises:
determining whether a data input/output (IO) bus is in a busy state;
transferring the command to the corresponding concurrently addressable memory units when the data IO bus is not in a busy state; and
sequentially searching queues for respective concurrently addressable memory units after a waiting period for the busy state to shift, when the data IO bus is in a busy state.

14. A non-volatile memory device, comprising:
a plurality of concurrently addressable memory units;
respective queues for the plurality of the concurrently addressable memory units, respectively; and
a memory control circuit, wherein the memory control circuit is configured to transfer a second command to respective queues for remaining concurrently addressable memory units while a first command is executed in some of the concurrently addressable memory units wherein a respective queue is in a corresponding concurrently addressable memory unit.

15. The non-volatile memory device as claimed in claim 14, wherein the plurality of queues is in the memory control circuit.

16. The non-volatile memory device as claimed in claim 14, wherein the memory control circuit includes an address decoder configured to decode a received address to determine which concurrently addressable memory units correspond to the first command.

* * * * *